United States Patent [19]

Oku et al.

[11] Patent Number: 5,032,234
[45] Date of Patent: Jul. 16, 1991

[54] PROCESS FOR PLATING A PRINTED CIRCUIT BOARD

[75] Inventors: Shunji Oku; Kiyoshi Seigenji, both of Osaka, Japan

[73] Assignee: Minolta Camera Kabushiki Kaisha, Osaka, Japan

[21] Appl. No.: 453,420

[22] Filed: Dec. 18, 1989

[30] Foreign Application Priority Data

Dec. 20, 1988 [JP] Japan .................. 63-322913

[51] Int. Cl.⁵ .................................................. C25D 5/02
[52] U.S. Cl. ........................................................ 204/15
[58] Field of Search ........................................... 204/15

[56] References Cited

FOREIGN PATENT DOCUMENTS 56-1389 1/1981 Japan .
57-9894 1/1982 Japan .
57-207393 12/1982 Japan .
59-145569 9/1984 Japan .
840544 7/1960 United Kingdom .

Primary Examiner—T. M. Tufariello
Attorney, Agent, or Firm—Joseph W. Price

[57] ABSTRACT

A printed circuit board is plated through the steps of providing a printed circuit board, covering at least a predetermined portion to be plated of the printed circuit board with a mask, sealing tightly the periphery of the concavity by sandwiching a sealing material between the mask and the circuit board, providing an electric contact piece, filling up the space with plating solution, connecting the electric contact piece to a power supply, and supplying a plating electric current to the predetermined portion to be plated of the printed circuit board.

12 Claims, 3 Drawing Sheets

PROCESS FOR PLATING A PRINTED CIRCUIT BOARD

BACKGROUND OF THE INVENTION

1. Field of the Invention

The present invention relates to processes for the electro-plating of a printed circuit board and, more particularly, to processes for facilitating the electro-gold-plating of a printed circuit board which has necessary circuit elements and circuit patterns provided by etching a surface of a copper clad laminate substrate. Some of the circuit patterns conduct signals only between the circuit elements on the same circuit board, but do not have electrical connection with the exterior of the circuit board.

2. Description of Prior Art

A circuit pattern on a printed circuit board is generally composed of a number of electrically independent conductive segments. In a conventional process for electro-plating predetermined portions of the independent conductive segments, some peripheral conductive patterns are provided from the conductive segments to the periphery of the circuit board so as to surround the periphery. One of plating electrodes and the peripheral conductive patterns are connected to supply plating electric current, with the result that the predetermined portions of the conductive segments are plated with conductive material.

There have been known some methods to deposit desired conductive material on selected areas of the circuit board and to prevent the conductive material from piling on undesired areas, for example, printing a resist layer, pressing a mask down on the circuit board with using some jig, or providing some contrivance for applying plating solution only to the certain areas. Anyway, the circuit board is soaked in an appropriate electrolyte bath. The plating solution bath and a certain point on the peripheral conductive patterns functions as a pair of electrodes. An electric current flows from an outside power source through therebetween to deposit desired conductive material on the selected areas of the circuit board.

However, there have been a problem. That is, the whole circuit board is dipped into the electrolyte solution in the conventional plating step, therefore a large quantity of electrolyte solution is necessary. Further, there is high possibility that some undesired portions of the circuit board and the jig are unnecessary plated, or that a little electrolyte solution is taken away in accordance with pulling out the circuit board from the electrolyte solution after plating step, resulting a waste of expensive plating material such as gold.

In addition, the electric current from the outside power source is supplied by only one pair of electrodes and flows thorough all independent conductive segments. The total length of the circuit is quite long and the circuit configuration is complicated, therefore electric resistance may be uneven at each conductive segments. As a result, the thickness of the deposited conductive material becomes inappropriately irregular.

By the way, there is a case where any peripheral conductive pattern can not be extended from a desired independent conductive segment to the periphery of the circuit board because of the desired circuit configuration. In this case, the desired independent conductive segment is temporally connected to another close conductive segment by an additional conductive pattern, so that an electric current flows from a peripheral conductive pattern through the desired conductive segment. Such an additional conductive pattern, practically, which is unnecessary in the final printing circuit configuration, is called as a "plating lead pattern". The plating lead patterns are only necessary as an intermediate step in the plating step of the printed circuit board. The desired primary conductive segments must again be electrically isolated. Thus, the electrical interconnection between the independent conductive segments must be removed before the printed circuit board is finished.

A prior art method of isolating the independent conductive segments from each other is disclosed in FIG. 6, wherein the plating lead patterns are physically cut off by drilling holes in the printed circuit board with using a cutter or a drill. Thus, in FIG. 6, a numeral 20 indicates a printed circuit board, a numeral 21 indicates a conductive pattern, a shaded portion 22 indicates an area to be plated and a numeral 24 indicates a plating lead pattern. A circled portion B indicates a drilled hole where the electrical connection between the independent conductive segments has been removed. As can be readily appreciated, by simply cutting off the plating lead patterns with a hole drilling technique, there still remain cut off sections of the plating lead patterns which are exposed and remain in contact with the desired independent conductive segments of the printed circuit board. Thus, there remains a risk that these independent segments may be shorted out or connected each other if a cut off section unintentionally contacts with conductive material to bridge the drilled hole.

An additional problem occurs in any production process desiring to produce a printed circuit board of an extremely high density. In such a design, the space between the respective conductive lines requires a distinct limitation on the compacting of the circuit pattern. Utilizing a plating lead pattern to interconnect the independent conductive segments while permitting a drilling or cutting off of the lead line, which is part of the finishing step, clearly creates a significant design problem. The deposited primary conductive pattern must be designed so that any essential component of conductive material in the desired final pattern should not be endangered in being cut off through any drilling step. If the design suggests that the plating lead pattern must be removed in a space between desired conductive segments which is smaller than the diameter of a drill, for example, as shown by circle A in FIG. 6, an alternative partial step for removing the plating lead pattern, such as a grinding or an abrading step, would be necessary instead of the drilling or cutting off step.

In one conventional process for producing a printed circuit board, a plurality of independent conductive segments and a plurality of plating lead patterns, which interconnect the independent conductive segments, are created on an insulating substrate. This is accomplished, for example, by etching a surface of a copper-clad laminate substrate. Subsequently, predetermined portions of the conductive segments are plated electrically to deposit an additional conductive material. Finally, the plating lead patterns are partially removed by drilling or, if necessary, grinding to insulate the independent conductive segments each other, resulting the final configuration of the printed circuit board.

SUMMARY OF THE INVENTION

An object of the present invention is to provide an improved process for the electro-plating of a printed circuit board while simplifying the number of processing steps necessary to accomplish this goal.

Another object of the present invention is to provide a process for the electro-plating of a printed circuit board wherein a plating lead pattern cutting process such as the drilling holes step or the grinding or abrading step is omitted.

A further object of the present invention is to provide a process for the electro-plating of a printed circuit board wherein freedom of design of the circuit configuration is improved and a pattern of electro-conductive layers can be densely packed on the printed circuit board substrates to meet the needs of modern industry.

The present invention comprises a method of plating a printed circuit board comprising the steps of: providing a printed circuit board; covering at least a predetermined portion to be plated of the printed circuit board with a mask, said mask having a concavity on its printed circuit board side surface so as to make a space between the mask and the printed circuit board; sealing tightly the periphery of said concavity by sandwiching a sealing material between the mask and the circuit board, so that the space is sealed by the mask, the sealing material and the circuit board; providing an electric contact piece in the vicinity of or inside the space, said electric contact piece being electrically connected with the predetermined portion to be plated of the printed circuit board; filling up said space with plating solution; connecting said electric contact piece to a power supply; and supplying a plating electric current to the predetermined portion to be plated of the printed circuit board.

The features of the present invention which are believed to be novel are set forth with particularity in the appended claims. The present invention, both as to its organization and manner or operation, together with further objects and advantages thereof, may best be understood by references to the following description, taken in conjunction with the accompanying drawings.

DESCRIPTION OF THE PREFERRED EMBODIMENTS

The following specification, taken in conjunction with the drawings, sets forth the process steps and product of the present invention in such a manner to enable any person skilled in the art to utilize the invention. The embodiments of the invention disclosed herein are the best modes contemplated by the inventors of carrying out their invention in a commercial environment, although it should be understood that various modifications can be accomplished within the parameters of the invention.

A printed circuit plating process according to the first embodiment of the present invention will be subsequently described in conjunction with FIGS. 1 through 4.

Figure 1:
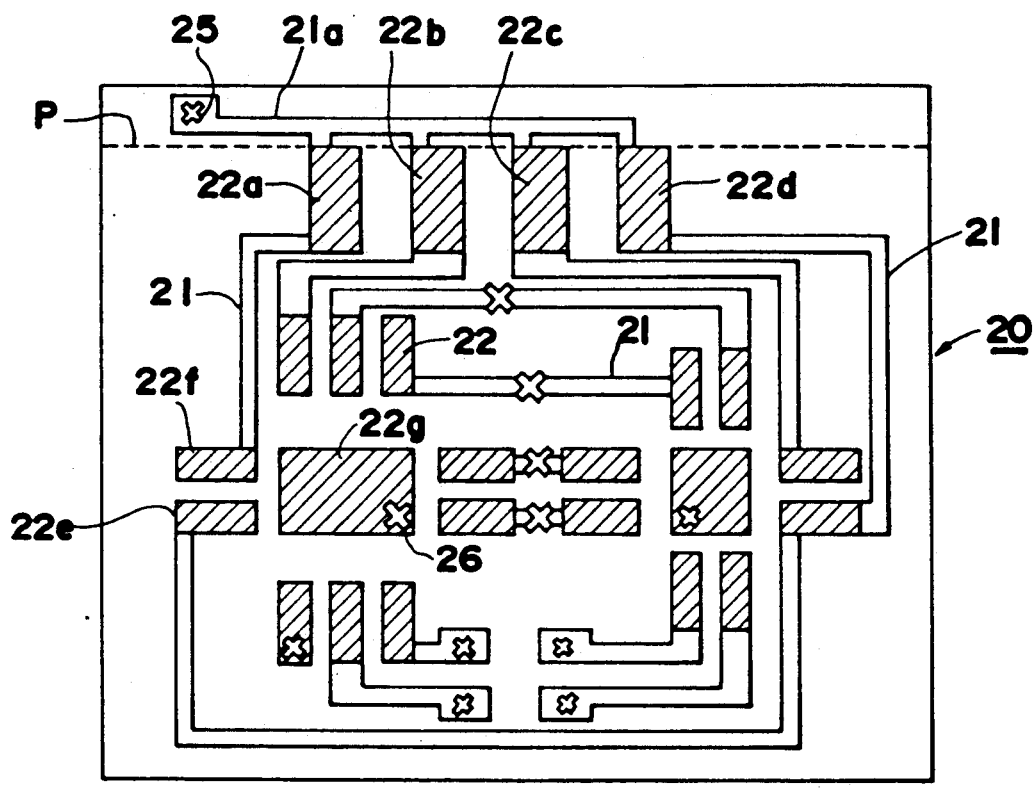
FIG. 1 shows a plan view of a printed circuit board according to an embodiment of the present invention, to which the plating process of the present invention is to be applied.
Figure 2:
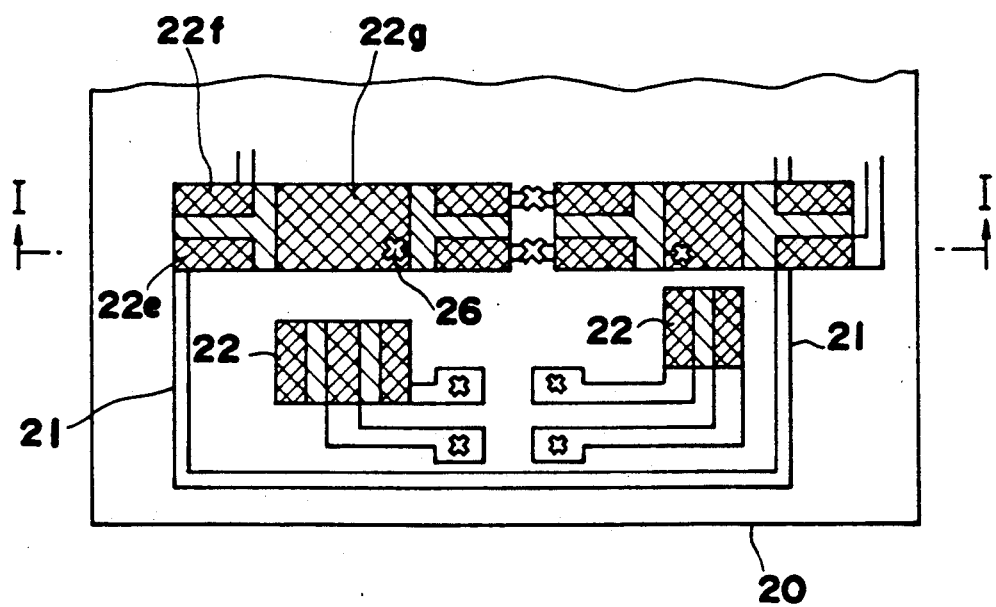
FIG. 2 shows a plan view showing a half part of the printed circuit board indicating those portions of the printed circuit board that are to be soaked in an electrolyte solution.

In FIG. 1, a printed circuit board 20 has on its surface a plurality of electro-conductive patterns 21 of a desired circuit configuration. The shaded portions 22 of the conductive patterns 21 are desired to be plated electrically. These shaded portions 22 are wholly covered with a mask 1. Then, the shaded portions 22 covered with the mask 1 are plated electrically, but the whole printed circuit board is not soaked into an electrolyte solution bath. Just the bigger shaded portions shown in FIG. 2, which can be distinguished by the wider parallel lines than that of the shaded portions 22, are soaked in an electrolyte solution.

Figure 3:
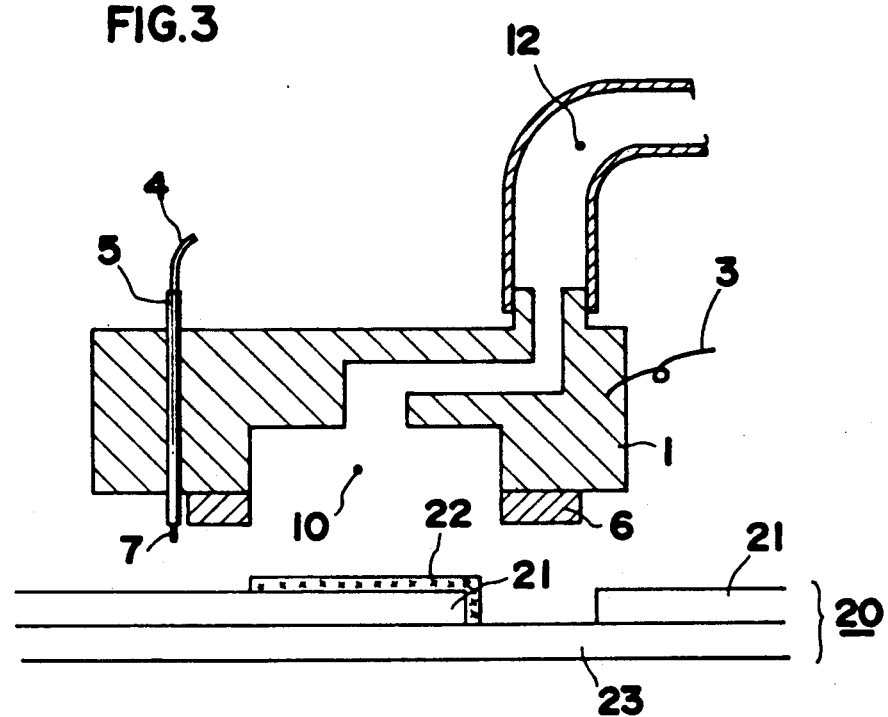
FIG. 3 is a cross-sectional view showing the printed circuit board and a mask used in an embodiment of the present invention.

FIG. 3 shows an embodiment of a mask and the circuit board of the present invention. The printed circuit board 20 comprises an insulating substrate 23 and the conductive patterns 21. The portion 22 is desired to be plated electrically and in FIG. 3 the portion 22 has already been plated with some conductive material. The above-mentioned mask 1 functions also as one of plating electrodes in this embodiment. A concavity 10 is formed on the circuit board side surface of the mask 1 so that the concavity 10 and the printed circuit board 20 form a room 10 which functions as an electrolyte solution bath. The electrolyte solution is provided through a pipe 12 to fill up the room 10. A lead 3 is connected with the mask 1 to supply an electric current from an outside power source. Another lead 4 is also provided for passing the electric current, which has a contact piece 7 at its tip and is threaded through an insulation sheath 5 penetrating the mask 1. An insulation seal 6 is put on the periphery of the concavity 10 to plug up the space between the mask 1 and the printed circuit board 20. Therefore, the concavity 10 becomes a tightly sealed electrolyte solution bath when the mask 1 is pressed against the circuit board 20, sandwiching the insulation seal 6. At the same time, the contact piece 7 is pressed by its own elasticity or an other appropriate press means against a certain contact point which is on the conductive pattern 21 and outside the seal 6, the pattern 21 being connected with the portion to be plated 22. As a result, one electrode or the mask 1 and the other electrode or the portion 22 compose a plating circuit to apply conductive material on only the desired portion 22.

Figure 4:
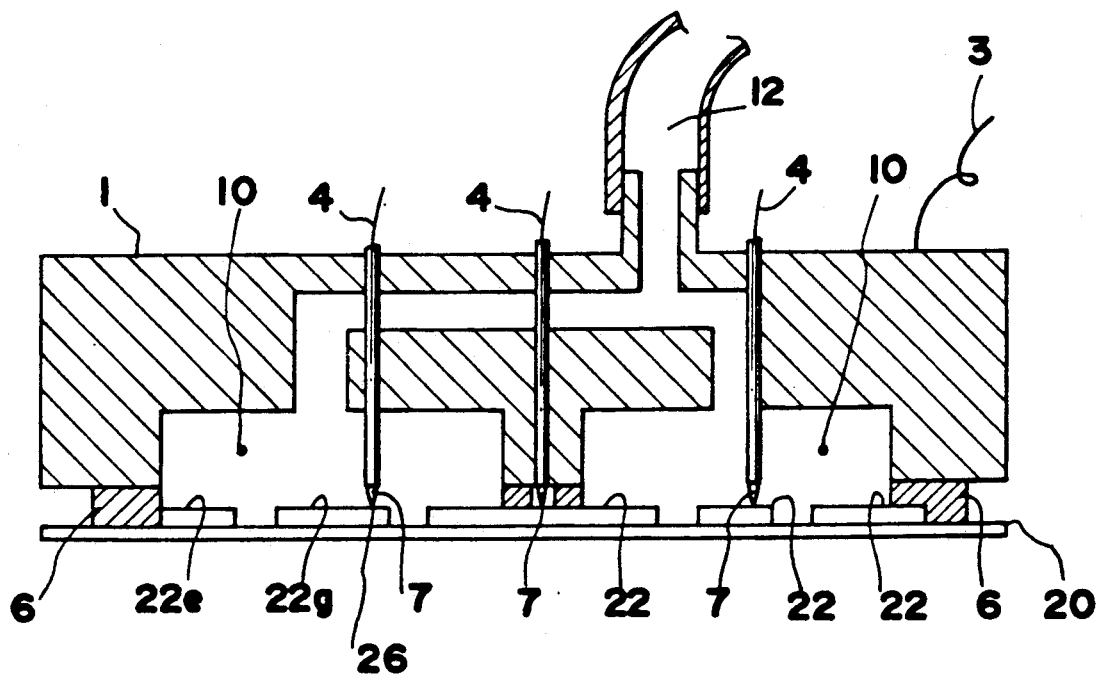
FIG. 4 is a fragmentary view taken I and I of the above-mentioned printed circuit board shown in FIG. 2 whose surface is covered with a mask.

The above-mentioned contact piece 7 comes into contact with the certain contact point indicated by a white cross in FIG. 1. In FIG. 1, the four shaded portions 22a, 22b, 22c and 22d are connected by a peripheral conductive pattern 21a and all of the four portions are covered with the same mask 1 at once and plated, while the contact piece 7 touches a contact point indicated by a white cross 25 so that an electric current passes through all of the four portions. After the plating process, the printed circuit board 20 is cut in two at a dotted line P so as to isolate electrically the four portions 22a, 22b, 22c and 22d from each other. Another shaded portions to be plated 22e and 22f are covered with another mask 1 shown in FIG. 4. FIG. 4 shows a fragmentary view taken I and I of FIG. 2. An electric current flows through the portion 22e, the conductive pattern 21, the portion 22d and the peripheral conductive pattern 21a, or the portion 22f, the conductive pattern 21, the portion 22a and the peripheral conductive pattern 21a, and then returns to an outside power source via the contact point 25, the contact piece 7 and the lead 4. That is, it is unnecessary to make physically direct contact between the contact piece 7 and the portions 22e or 22f. As for an isolated portion 22g which is covered together with the portions 22e and 22f, however, the electric current has no return way. Therefore, a contact piece 7 is put to a contact point indicated by a white cross 26.

As is shown in FIGS. 1 and 4, the printed circuit board 20 comprises a plurality of independent segments of conductive patterns 21. The contact piece 7 is provided one-by-one for each independent segment of conductive patterns 21.

Figure 5:
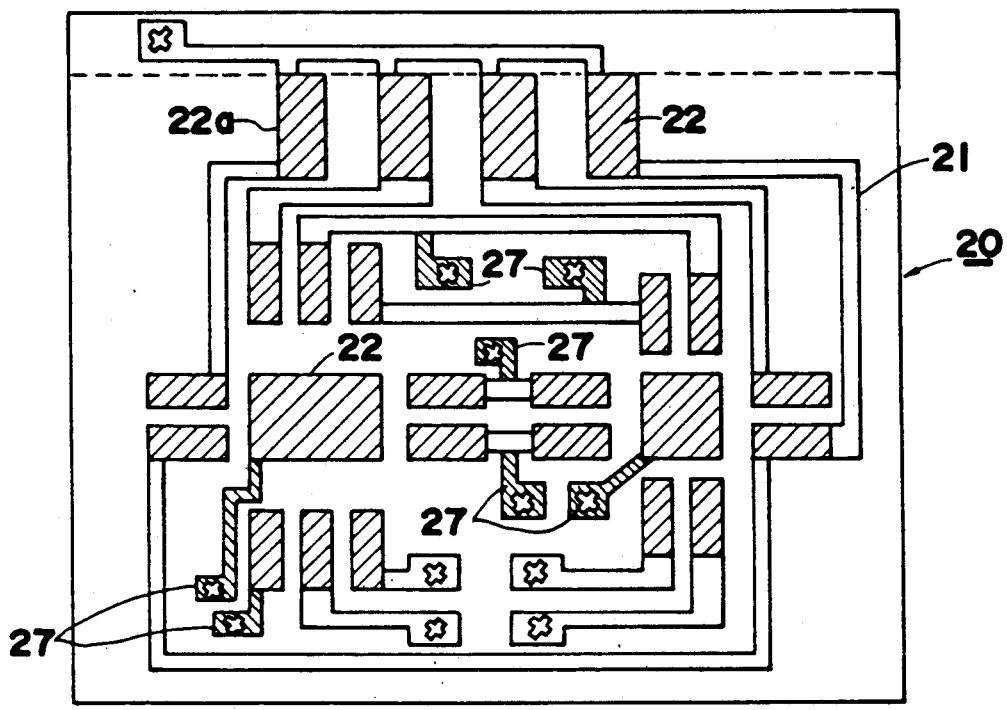
FIG. 5 shows a plan view of a printed circuit board according to another embodiment of the present invention.
Figure 6:
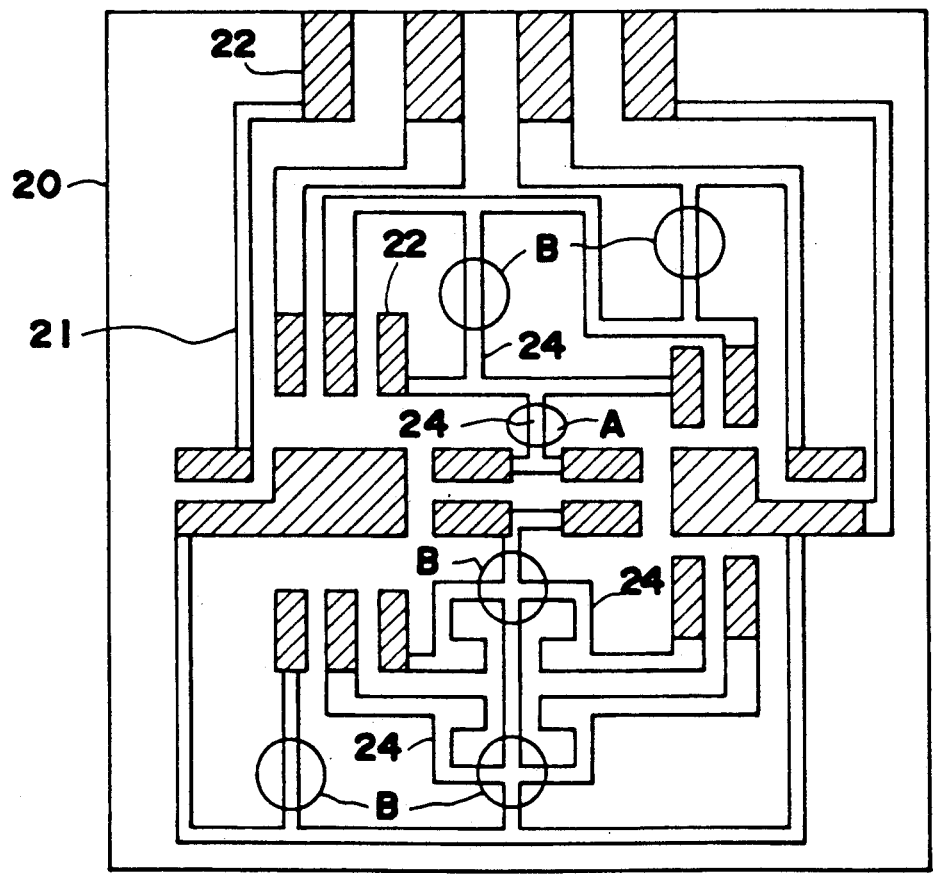
FIG. 6 is a plan view of a printed circuit board of the prior art showing a method for partially removing plating lead patterns that are interconnecting independent conductive segments on the conventional printed circuit board.

Referring to FIG. 5, an alternative process for plating a printed circuit board is disclosed. In the above-mentioned first embodiment, some contact points (indicated by white crosses) are positioned outside the concavities 10 but others are positioned inside the concavities 10. For example, the contact points indicated by the white cross 26 is inside the concavity 10 in FIG. 4. Thus, the contact point 26 remains not plated, resulting unevenness of the thickness of the conductive material deposited on the portion 22g. Further, the contact piece 7 soaks itself in the electrolyte solution in the latter case, so the contact piece 7 itself is improperly plated. It is waste of plating material, especially as for the gold-plating.

In order to solve the above-mentioned problems, in the second embodiment, additional extension conductive patterns which are indicated by shaded portions 27 are provided to extend to the outside of the seal 6 when the mask 1 is settled on the circuit board 20. And a contact piece 7 contacts a contact point indicated by a white cross in FIG. 5, which is provided on the extension conductive pattern 27. As the result, all contact pieces 7 are prevented from unnecessarily being plated, and the desired portions 22 are plated evenly.

In the above-mentioned two embodiments, a mask functions also as one of plating electrodes for supplying an electric current. However, it is possible to set an independent electrode outside the mask. In this case, when the mask 1 is made of an insulating material, the lead 4 is not required to be insulated from the mask 1, and of course, the insulation sheath 5 is unnecessary.

Further, the leads 4 and the contact pieces 7 are held by the mask 1 in the present embodiments. However, the contact piece 7 can be held by another means, separated from the mask 1, in the vicinity of the mask 1, for example: providing a common support member for supporting both the mask 1 and the contact piece 7 against the printed circuit board 20; or providing independent support members respectively for the mask 1 and the contact piece 7.

In summary, the advantages of the present invention are somewhat self-evident. The prior plating lead patterns, which interconnect the independent conductive segments, are unnecessary in the present invention. The desired portions to be plated can be plated separately in every independent segment. That is, every independent conductive segment has its own a pair of electrodes for supplying electric current. Therefore, the prior plating lead patterns removing step can be omitted. As can be readily appreciated, the desired final conductive patterns of the desired circuit configuration can be designed to be relatively compactly spaced, and it is not necessary to make allowance to provide sufficient space and location for the plating lead patterns. What is more, it becomes easy to control voltage of electric current and electric resistance at each segment. Therefore, the thickness of the deposited conductive material can be not only uniform but also adjustable at every segment. Furthermore, the plating process can be given in condition that a printed circuit board is laid on a rigid and stable stand with a mask placed on the printed circuit board. Then, the efficiency and reliability of the plating process can be improved.

As can be appreciated, many of the parameters of the above processes can be varied within conventional knowledge, since they are interdependent depending upon terms of time, temperature, concentration, etc. While the present invention has been described with reference to the particular embodiments mentioned above, it should be understood that numerous modifications may be made by those skilled in the art without actually departing from the spirit and scope of the invention, which should be determined solely from the following claims.

What is claimed is:

1. A process for plating a printed circuit board comprising the steps of:

providing a printed circuit board, said printed circuit board having an insulating substrate and a conductive circuit pattern on a surface of the insulating substrate;

covering at least a predetermined portion to be plated of the conductive circuit pattern of the printed circuit board with a mask, said mask having a concavity on its printed circuit board side surface so as to make a space between the mask and the printed circuit board;

sealing tightly the periphery of said concavity by sandwiching a sealing material between the mask and the circuit board, so that the space is sealed by the mask, the sealing material and the circuit board;

providing a power supply;

providing a first electrode and a second electrode, said first electrode being provided insulated from the predetermined portion to be plated of the conductive circuit pattern, and said second electrode being an electric contact piece provided inside the space so as to come into contact with a certain point of the predetermined portion to be plated of the conductive circuit pattern;

filling up said space with plating solution;

connecting said first and second electrodes to the power supply; and supplying a plating electric current through, in the order named, the first electrode, the plating solution, the predetermined portion to be plated of the conductive circuit pattern, and the second electrode.

2. The process of claim 1 wherein the electric contact piece is held by the mask.

3. The process of claim 1 wherein the mask is utilized as the first electrode for supplying the plating electric current.

4. The process of claim 3 wherein the electric contact piece is electrically insulated from the mask.

5. The process of claim 1 wherein the conductive circuit pattern of the printed circuit board has a plurality of electrically independent segments, and the electric contact piece is provided one-by-one for each independent segment.

6. A process for plating a printed circuit board comprising the steps of:
providing a printed circuit board, said printed circuit board having an insulating substrate and a conductive circuit pattern on a surface of the insulating substrate;
covering at least a predetermined portion to be plated of the conductive circuit pattern of the printed circuit board with a mask, said mask having a concavity on its printed circuit board side surface so as to make a space between the mask and the printed circuit board;
sealing tightly the periphery of said concavity by sandwiching a sealing material between the mask and the circuit board, so that the space is sealed by the mask, the sealing material and the circuit board;
providing a power supply
providing a first electrode and a second electrode, said first electrode being provided insulated from the predetermined portion to be plated of the conductive circuit pattern, and said second electrode being an electric contact piece provided in the vicinity of the space so as to be electrically connected with the predetermined portion to be plated of the conductive circuit pattern;
filling up said space with plating solution;
connecting said first and second electrodes to the power supply; and
supplying a plating electric current through, in the order named, the first electrode, the plating solution, the predetermined portion to be plated of the conductive circuit pattern, and the second electrode.

7. The process of claim 6 wherein the electric contact piece is held by the mask.

8. The process of claim 6 wherein the electric contact piece is provided in the vicinity of the mask.

9. The process of claim 6 wherein the mask is utilized as the first electrode for supplying the plating electric current.

10. The process of claim 9 wherein the electric contact piece is electrically insulated from the mask.

11. The process of claim 6 wherein the conductive circuit pattern of the printed circuit board has a plurality of electrically independent segments, and the electric contact piece is provided one-by-one for each independent segment.

12. The process of claim 6 further comprising a step to develop an extension conductive pattern on the printed circuit board, said extension conductive pattern being electrically connected with the predetermined portion to be plated and extended to the outside of the space, and the electric contact piece coming into contact with said extension conductive pattern for supplying the plating electric current.

* * * * *